(12) United States Patent
Virkar et al.

(10) Patent No.: US 11,968,787 B2
(45) Date of Patent: Apr. 23, 2024

(54) METAL NANOWIRE NETWORKS AND TRANSPARENT CONDUCTIVE MATERIAL

(71) Applicant: C3Nano Inc., Hayward, CA (US)

(72) Inventors: Ajay Virkar, San Mateo, CA (US); Ying-Syi Li, Fremont, CA (US); Melburne C. LeMieux, San Jose, CA (US)

(73) Assignee: C3 Nano, Inc., Hayward, CA (US)

( * ) Notice: Subject to any disclaimer, the term of this patent is extended or adjusted under 35 U.S.C. 154(b) by 181 days.

(21) Appl. No.: 16/018,889

(22) Filed: Jun. 26, 2018

(65) Prior Publication Data
US 2018/0297840 A1   Oct. 18, 2018

Related U.S. Application Data

(62) Division of application No. 13/530,822, filed on Jun. 22, 2012, now Pat. No. 10,029,916.

(51) Int. Cl.
| | | |
|---|---|---|
| H10K 30/00 | (2023.01) | |
| B82Y 30/00 | (2011.01) | |
| H05K 1/09 | (2006.01) | |
| H05K 3/12 | (2006.01) | |

(52) U.S. Cl.
CPC ............ H05K 3/1283 (2013.01); B82Y 30/00 (2013.01); H05K 1/097 (2013.01); H05K 2201/0108 (2013.01); H05K 2201/026 (2013.01)

(58) Field of Classification Search
CPC .................................................. H05K 1/097
See application file for complete search history.

(56) References Cited

U.S. PATENT DOCUMENTS

| | | |
|---|---|---|
| 6,741,019 B1 | 5/2004 | Filas et al. |
| 7,218,004 B2 | 5/2007 | Pan et al. |
| 7,849,424 B2 | 12/2010 | Wolk et al. |
| 7,902,639 B2 | 3/2011 | Garrou et al. |
| 7,922,787 B2 | 4/2011 | Wang et al. |
| 8,018,563 B2 | 9/2011 | Jones et al. |
| 8,018,568 B2 | 9/2011 | Allemand et al. |
| 8,031,180 B2 | 10/2011 | Miyamoto et al. |

(Continued)

FOREIGN PATENT DOCUMENTS

| | | |
|---|---|---|
| CN | 1399317 A | 2/2003 |
| CN | 101128550 A | 2/2008 |

(Continued)

OTHER PUBLICATIONS

Liu et al. "Silver nanowire-based transparent, flexible, and conductive thin film" (Jan. 2011).*

(Continued)

*Primary Examiner* — Austin Murata
(74) *Attorney, Agent, or Firm* — Christensen, Fonder, Dardi PLLC; Elizabeth A. Gallo; Peter S. Dardi

(57) ABSTRACT

A method of forming a transparent electrically conductive film including depositing a dispersion of metal nanowires onto a substrate surface, delivering a solution including a fusing agent in a solvent onto the substrate surface, and drying the substrate surface after depositing the metal nanowires and delivering the fusing agent solution to fuse at least some of the metal nanowires into the transparent electrically conductive film comprising a fused metal nanowire network.

14 Claims, 8 Drawing Sheets

(56) References Cited

U.S. PATENT DOCUMENTS

| | | |
|---|---|---|
| 8,049,333 B2 | 11/2011 | Alden et al. |
| 8,052,773 B2 | 11/2011 | Takada |
| 8,094,247 B2 | 1/2012 | Allemand et al. |
| 8,174,667 B2 | 5/2012 | Allemand et al. |
| 8,198,796 B2 | 6/2012 | Takada |
| 9,150,746 B1 | 10/2015 | Li et al. |
| 9,183,968 B1 | 11/2015 | Li et al. |
| 9,396,843 B2 | 7/2016 | Chung et al. |
| 9,447,301 B2 | 9/2016 | Li et al. |
| 10,026,518 B2 | 6/2018 | Sepa et al. |
| 10,020,807 B2 | 7/2018 | Virkar et al. |
| 10,100,213 B2 | 10/2018 | Li et al. |
| 2003/0022518 A1 | 1/2003 | Munakata et al. |
| 2005/0074589 A1 | 4/2005 | Pan et al. |
| 2005/0196707 A1 | 9/2005 | Cok |
| 2005/0214480 A1 | 9/2005 | Garbar et al. |
| 2005/0215689 A1 | 9/2005 | Garbar et al. |
| 2006/0052947 A1 | 3/2006 | Hu |
| 2006/0083694 A1 | 4/2006 | Kodas et al. |
| 2006/0163744 A1 | 7/2006 | Vanheusden et al. |
| 2006/0205240 A1 | 9/2006 | Pan et al. |
| 2006/0286785 A1 | 12/2006 | Rogers et al. |
| 2007/0074316 A1 | 3/2007 | Alden et al. |
| 2008/0003130 A1 | 1/2008 | Xia et al. |
| 2008/0034921 A1 | 2/2008 | Vanheusden et al. |
| 2008/0050513 A1 | 2/2008 | Wang et al. |
| 2008/0143906 A1 | 6/2008 | Allemand et al. |
| 2008/0147019 A1 | 6/2008 | Song et al. |
| 2008/0210052 A1 | 9/2008 | Allemand |
| 2008/0213663 A1 | 9/2008 | Hu et al. |
| 2008/0259262 A1 | 10/2008 | Jones et al. |
| 2008/0283799 A1 | 11/2008 | Alden et al. |
| 2008/0286447 A1 | 11/2008 | Alden et al. |
| 2008/0286488 A1 | 11/2008 | Li et al. |
| 2008/0292979 A1 | 11/2008 | Ding et al. |
| 2008/0317982 A1 | 12/2008 | Hecht et al. |
| 2009/0011147 A1 | 1/2009 | Dictus |
| 2009/0052029 A1 | 2/2009 | Dai et al. |
| 2009/0088326 A1 | 4/2009 | Baecker |
| 2009/0098405 A1 | 4/2009 | Matsunami |
| 2009/0129004 A1 | 5/2009 | Gruner |
| 2009/0130433 A1 | 5/2009 | Takada |
| 2009/0166055 A1 | 7/2009 | Guiheen et al. |
| 2009/0196788 A1 | 8/2009 | Wang et al. |
| 2009/0223703 A1 | 9/2009 | Winoto |
| 2009/0242231 A1 | 10/2009 | Miyagisima et al. |
| 2009/0283304 A1 | 11/2009 | Winoto |
| 2009/0301769 A1 | 12/2009 | Seppa et al. |
| 2009/0305437 A1 | 12/2009 | Allemand et al. |
| 2009/0311530 A1 | 12/2009 | Hirai et al. |
| 2009/0317435 A1 | 12/2009 | Vandesteeg et al. |
| 2009/0321113 A1 | 12/2009 | Allemand et al. |
| 2009/0321364 A1 | 12/2009 | Spaid et al. |
| 2010/0078197 A1 | 4/2010 | Miyagishima et al. |
| 2010/0078602 A1 | 4/2010 | Hosoya et al. |
| 2010/0140564 A1 | 6/2010 | Overbeek et al. |
| 2010/0197068 A1 | 8/2010 | Poon et al. |
| 2010/0243295 A1 | 9/2010 | Allemand et al. |
| 2010/0307792 A1 | 12/2010 | Allemand et al. |
| 2011/0024159 A1 | 2/2011 | Allemand et al. |
| 2011/0042126 A1 | 2/2011 | Spaid et al. |
| 2011/0045272 A1 | 2/2011 | Allemand |
| 2011/0048170 A1 | 3/2011 | Bhatia et al. |
| 2011/0062389 A1 | 3/2011 | Wang et al. |
| 2011/0088770 A1 | 4/2011 | Allemand et al. |
| 2011/0094651 A1 | 4/2011 | Kuriki |
| 2011/0095275 A1 | 4/2011 | Li et al. |
| 2011/0120749 A1 | 5/2011 | Yeo et al. |
| 2011/0151211 A1 | 6/2011 | Chang et al. |
| 2011/0162870 A1 | 7/2011 | Markovich et al. |
| 2011/0163403 A1 | 7/2011 | Bhatia et al. |
| 2011/0174190 A1 | 7/2011 | Sepa et al. |
| 2011/0192633 A1 | 8/2011 | Allemand |
| 2011/0253668 A1 | 10/2011 | Winoto et al. |
| 2011/0281070 A1 | 11/2011 | Mittal et al. |
| 2011/0285019 A1 | 11/2011 | Alden et al. |
| 2011/0297642 A1 | 12/2011 | Allemand et al. |
| 2012/0033367 A1 | 2/2012 | Jones et al. |
| 2012/0034129 A1 | 2/2012 | Suh et al. |
| 2012/0073947 A1 | 3/2012 | Sakata et al. |
| 2012/0097059 A1 | 4/2012 | Allemand et al. |
| 2012/0103660 A1 | 5/2012 | Gupta et al. |
| 2012/0104374 A1 | 5/2012 | Allemand |
| 2012/0107598 A1 | 5/2012 | Zou et al. |
| 2012/0127097 A1 | 5/2012 | Gaynor et al. |
| 2012/0127113 A1 | 5/2012 | Yau et al. |
| 2012/0132930 A1 | 5/2012 | Young et al. |
| 2012/0138913 A1 | 6/2012 | Alsayed et al. |
| 2012/0152135 A1 | 6/2012 | Stebbins et al. |
| 2012/0168684 A1* | 7/2012 | Magdassi ............ B82Y 30/00 252/500 |
| 2012/0183768 A1 | 7/2012 | Kondo et al. |
| 2012/0217453 A1 | 8/2012 | Lowenthal et al. |
| 2012/0223358 A1 | 9/2012 | Pschenitzka |
| 2012/0249453 A1 | 10/2012 | Tsukamoto |
| 2013/0000952 A1 | 1/2013 | Srinivas et al. |
| 2013/0001478 A1 | 1/2013 | Allemand et al. |
| 2013/0056244 A1 | 3/2013 | Srinivas et al. |
| 2013/0146335 A1 | 6/2013 | Gambino et al. |
| 2013/0153829 A1 | 6/2013 | Kondo et al. |
| 2013/0189502 A1 | 7/2013 | Takahashi et al. |
| 2013/0266795 A1 | 10/2013 | Schultz et al. |
| 2013/0291683 A1 | 11/2013 | Sepa et al. |
| 2013/0342221 A1 | 12/2013 | Virkar et al. |
| 2014/0004371 A1 | 1/2014 | Chung et al. |
| 2014/0054515 A1 | 2/2014 | Lowenthawl et al. |
| 2014/0099486 A1 | 4/2014 | Ollmann et al. |
| 2014/0238833 A1 | 8/2014 | Virkar et al. |
| 2014/0251662 A1 | 9/2014 | Rotto et al. |
| 2014/0255707 A1 | 9/2014 | Philip et al. |
| 2014/0262454 A1 | 9/2014 | Zou et al. |
| 2014/0374146 A1 | 12/2014 | Saito et al. |
| 2015/0017457 A1 | 1/2015 | Mizuno et al. |
| 2015/0036276 A1 | 2/2015 | Kaneko et al. |
| 2015/0144380 A1 | 6/2015 | Yang et al. |
| 2015/0206623 A1 | 7/2015 | Poon |
| 2015/0208498 A1 | 7/2015 | Poon |
| 2015/0321257 A1 | 11/2015 | Suh et al. |
| 2016/0096967 A1 | 4/2016 | Virkar et al. |
| 2016/0108256 A1 | 4/2016 | Yang et al. |
| 2016/0122562 A1 | 5/2016 | Yang et al. |
| 2017/0015857 A1 | 1/2017 | Kodama et al. |

FOREIGN PATENT DOCUMENTS

| | | |
|---|---|---|
| CN | 101522947 A | 9/2009 |
| CN | 101589473 A | 11/2009 |
| CN | 102131602 A | 7/2011 |
| CN | 102193697 A | 9/2011 |
| CN | 102250506 A | 11/2011 |
| CN | 102544223 A | 7/2012 |
| CN | 102686777 A | 9/2012 |
| CN | 102763171 A | 10/2012 |
| CN | 102819338 A | 12/2012 |
| CN | 102819341 A | 12/2012 |
| CN | 102834472 A | 12/2012 |
| CN | 102883822 A | 1/2013 |
| CN | 102971805 A | 3/2013 |
| CN | 103380466 A | 10/2013 |
| CN | 103827790 A | 5/2014 |
| CN | 104508758 A | 4/2015 |
| CN | 104685577 B | 6/2015 |
| CN | 105102555 A | 11/2015 |
| CN | 105874889 B | 7/2019 |
| JP | 2009-129882 A | 6/2009 |
| JP | 2009-140750 A | 6/2009 |
| JP | 5289859 B2 | 2/2010 |
| JP | 2011-119142 A | 6/2011 |
| JP | 2011-210454 A | 10/2011 |
| JP | 2011-233514 A | 11/2011 |
| JP | 2012-009383 A | 1/2012 |
| JP | 2012-022844 A | 2/2012 |
| JP | 2012-216535 A | 11/2012 |
| JP | 2013-084628 A | 5/2013 |

(56) References Cited

FOREIGN PATENT DOCUMENTS

| JP | 2013-518603 A | 5/2013 |
|---|---|---|
| JP | 2013-214507 A | 10/2013 |
| JP | 2016-519206 A | 6/2016 |
| KR | 10-2007-0029151 | 3/2007 |
| KR | 10-2010-0098448 A | 9/2010 |
| KR | 2013-0027634 A | 3/2013 |
| KR | 2013-0102723 A | 9/2013 |
| TW | 2009-23971 A | 6/2009 |
| TW | 2009-39251 A | 9/2009 |
| TW | 2011-10144 A | 3/2011 |
| TW | 2011-37062 A | 11/2011 |
| TW | 2012-36967 A1 | 9/2012 |
| WO | 2005-005687 A1 | 1/2005 |
| WO | 2006-072959 A1 | 7/2006 |
| WO | 2008-046058 A2 | 4/2008 |
| WO | 2009-035059 A1 | 3/2009 |
| WO | 2009-086161 | 7/2009 |
| WO | 2009-156990 A1 | 12/2009 |
| WO | WO 2010/109465 * | 3/2010 |
| WO | 2010-036113 A1 | 4/2010 |
| WO | 2010-109465 A1 | 9/2010 |
| WO | 2010-129604 A1 | 11/2010 |
| WO | 2011-008227 A1 | 1/2011 |
| WO | 2011-088323 A2 | 7/2011 |
| WO | 2011-097470 A2 | 8/2011 |
| WO | 2011-106730 A2 | 9/2011 |
| WO | 2012-083082 A1 | 6/2012 |
| WO | 2012-102556 A2 | 8/2012 |
| WO | 2012-168941 A1 | 12/2012 |
| WO | 2013-006349 A1 | 1/2013 |
| WO | 2013-025330 A2 | 2/2013 |
| WO | 2013-040245 A2 | 3/2013 |
| WO | 2013-047556 A1 | 4/2013 |
| WO | 2013-056242 A1 | 4/2013 |
| WO | 2013-094926 A1 | 6/2013 |
| WO | 2013-095971 A1 | 6/2013 |
| WO | 2013-128458 A1 | 9/2013 |
| WO | 2013-133272 A1 | 9/2013 |
| WO | 2013-133285 A1 | 9/2013 |
| WO | 2014-127909 A1 | 8/2014 |
| WO | 2014-133890 A2 | 9/2014 |
| WO | 2015-077145 A2 | 5/2015 |

OTHER PUBLICATIONS

Bi et al., "In situ Oxidation synthesis of AG/AGCI core-shell nanowires and their photocatalytic properties," Chem. Commun. (2009), pp. 6551-6553.
De et al., "Silver Nanowire Networks as Flexible, Transparent Conducting Films: Extremely High DC to Optical Conductivity Ratio," ACS Nano, 3(7):1767-1774 (Jun. 2009).
Grouchko et al., "Conductive Inks with 'built-in' mechanism that enables sintering at room temperature," ACS Nano, 5(4):3354-3359 (2011).
Garnett et al., "Self-limited Plasmonic Welding of Silver Nanowire Junctions," Nature Materials, vol. 11, p. 241-249, Mar. 2012.
Hu et al., "Scalable coating properties of flexible, silver nanowire electrodes," ACS Nano, 4(5):2955-2963 (2010).
Lam et al., "Self-diffusion in silver at low temperatures," Phys. Stat. Sol. (b), 57 (1973), p. 225-236.
Liu et al., "Silver Nanowire-Based Transparent, Flexible and Conductive Thin Film," Nanoscale Research Letters, vol. 6(75), Jan. 2011, 8 pages.
Luo et al., "Size effect on thermodynamic properties of silver nanoparticles," J. Phys. Chem. C, 112 (2008), pp. 2359-2369.
Magdassi et al., "Triggering the Sintering of Silver Nanoparticles at Room Temperature," ACS Nano, 4(4):1943-1948 (2010).
Nanda, et al., "Higher surface free energy of free nanoparticles," Phys. Rev. Letters, 91(10):106102-1 (2003).
Pothoven, "Laser Patterning of Silver Nanowires," Information Display Magazine, Sep. 2012, 28(9), (10 pages).
Raaen, A.M., "Diffusion in silver fluoride," Physical Review B, 21(10):4895-4897 (1980).
Redmond et al., "Electrochemical Ostwald ripening of colloidal Ag particles on conductive substrates," Nano Letters, 5(1):131-135 (2005).
Safaei et al., "Modeling the Melting Temperature of Nanoparticles by an Analytical Approach," J. Phys. Chem. C, 112 (2008), pp. 99-105.
Spechler et al., "Direct Write Pulsed Laser Processed Silver Nanowire Networks for Transparent Conducting Electrodes," Springer-Verlag, vol. 108, pp. 25-28, May 10, 2012.
Sun et al., "AgCl nanoparticle nanowires fabricated by template method," Materials Letters, 61 (2007), pp. 1645-1648.
Tokuno et al., "Fabrication of Silver Nanowire Transparent Electrodes at Room Tempature," Nano Research, (2011), 4(12): 1215-1222.
Van Heyningen, R., "Electron Drift Mobility in Silver Chloride," Physical Review, (Dec. 1, 1962), pp. 2112-2118.
Yan et al., "Recent Research Progress on Preparation of Silver Nanowires by Soft Solution Method," Rev. Adv. Mater. Sci. 24, (2010), pp. 10-15.
Zhu et al., "Transferable Sefl-welding Silver Nanowire Network as High Performance Transparent Flexible Electrode," Nanotechnology 24, (Jul. 26, 2013), 24(335202): 1-7.
International Search Report and Written Opinion for co-pending application PCT/US2013/046866 dated Dec. 27, 2013 (15 pages).
Allen, "Photoinitiators for UV and visible curing of coatings: mechanisms and properties", Journal of Photochemistry and Photobiology A Chemistry, vol. 100, (1996) p. 101-107.
Bermocoll® E 230 FQ Product Information, Akzo Nobel Chemicals AG, Performance Additives, www.akzonobel.com/pa.
Cambrios Archived Website, ClearOhm, "High Performance Transparent Conductive Material", Cambrios Technologies Corporation, Nov. 2010.
Chen et al., "Polysaccharide Hydrogenls for Protein Drug Delivery", Carbohydrate Polymers, 28, (1995), p. 69-76.
Coskun et al., "Optimization of silver nanowire networks for polymer light emitting diode electrodes", Nanotechnology, 24, 125202, (2013) p. 1-9.
Ducamp-Sanguesa et al. "Synthesis and Characterization of Fine and Monodisperse Silver Particles of Uniform Shape", Journal of Solid State Chemistry, vol. 100 pp. 272-280 (1992).
Gu, Shouwu, "The Creation of Nanojunctions", The Royal Society of Chemistry, Nanoscale, (2010), 2, pp. 2521-2529.
Hu et al., "Metal nanogrids, nanowires, and nanofibers for transparent electrodes", MRS Bulletin, vol. 36, p. 1-7, Oct. 2011.
Imam et al., "Biobased adhesives, gums, emulsions, and binders: current trends and future prospects", Journal of Adhesion Science and Technology, vol. 27, Nos. 18-19, 1972-1997, (2013).
Kang et al., "Halide Welding for Silver Nanowire Network Electrode," ACS Applied Materials & Interfaces 2017, 9, 30779-30785, Apr. 18, 2017.
Kang et al., "Epitaxial-Growth-Induced Junction Welding of Silver Nanowire Network Electrodes" CS Nano 2018, 12, 4894-4902, Apr. 2018.
Khanarian et al., "The Optical and Electrical Properties of Silver Nanowire Mesh Films", Journal of Applied Physics, 114(024302), doi: 10.1063/1.4812390, (2013).
Kim et al., "Large Discrete Resistance Jump at Grain Boundary in Copper Nanowire", American Chemical Society Nano Letters 2010, 10, 3096-3100, Jul. 7, 2010.
Kumar et al., "Silver nanowire based flexible electrodes with improved properties: High conductivity, transparency, adhesion and low haze", Material Research Bulletin, vol. 48, (2013), p. 2944-2949.
Kunjappu, "Ink Chemistry", www.chemistryworld.com/news/ink-chemistry/3002158.article, p. 1-18, Feb. 20, 2019.
Lu et al., "Cold Welding of Ultrathin Gold Nanowires", Nature Nanotechnology, vol. 5, p. 1-7, Mar. 2010.

(56) References Cited

OTHER PUBLICATIONS

Ma et al., "Synthesis of small silver nanocubes in a hydrophobic solvent by introducing oxidative etching with Fe(III) species†", Journal of Materials Chemistry 2010, 20, 3586-3589, Apr. 9, 2010.
Madaria et al., "Uniform, Highly Conductive, and Patterned Transparent Films of a Percolating Silver Nanowire Network on Rigid and Flexible Substrates Using a Dry Transfer Technique", NanoRes, (2010) 3: 564-573.
Martin et al., "Hydrophilic Matrix Tablets for Oral Controlled Release", AAPS Advances in the Pharmaceutical Sciences Series 16, DOI 10.1007/978-1-4939-1519-4_5. (2014).
Poole, C.F., "Pyrolysis Gas Chromatography", Gas Chromatography, Chapter 11, Elservier Inc., (2012).
Sun et al., "Crystalline Silver Nanowires by Soft Solution Processing", ACS Nano Letters 2002, vol. 2 No. 2, 165-168, Jan. 3, 2002.
Wang et al., "Water-Soluble Ethylhydroxyethyl Cellulose Prevents Bacterial Translocation Induced by Major Liver Resection in the Rat", Annals of Surgery, vol. 217 No. 2, p. 155-167, (1993).
Wiley et al., "Polyol Synthesis of Silver Nanostructures: Control of Product Morphology with Fe(II) or Fe(III) Species", ACS Journal of Surfaces and Colloids, vol. 21 No. 18, 8077-8080, Aug. 30, 2005.
Huang et al., "Self-Limited Nanosoldering of Silver Nanowires for High-Performance Flexible Transparent Heaters", ACS Applied Materials & Interfaces, 11, 21850-21858, (2019).
Lee et al., "Very Long Ag Nanowire Synthesis and its Application in a Highly Transparent Conductive and Flexible Metal Electrode Touch Panel", Nanoscale, vol. 4, p. 6408-6414, (2012).
Chang et al., "Highly foldable transparent conductive films composed of silver nanowire junctions prepared by chemical metal reduction," Nanotechnology 25 (2014) 285601.
Declaration of George Gruner, Ph.D. in Support of Patent Owner Preliminary Response for U.S. Pat. No. 9,183,968 dated May 13, 2019.
Decision on Appeal for corresponding U.S. Appl. No. 14/087,669 dated Sep. 28, 2021.
Decision on Denying Institution of Inter Partes Review for corresponding U.S. Pat. No. 9,183,968 dated Aug. 9, 2019.

* cited by examiner

Fig. 7
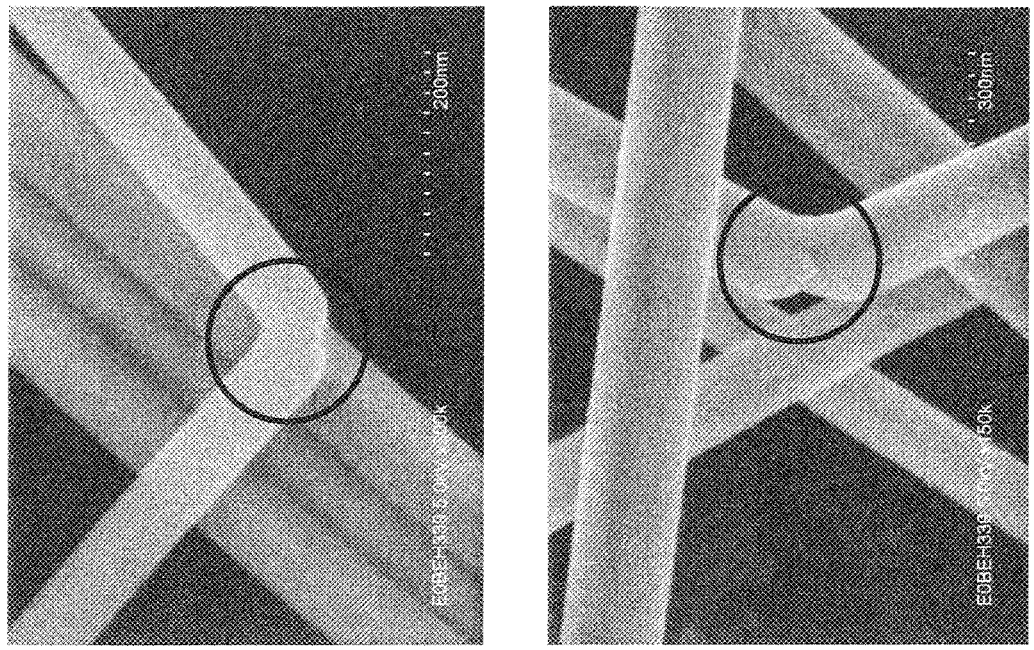
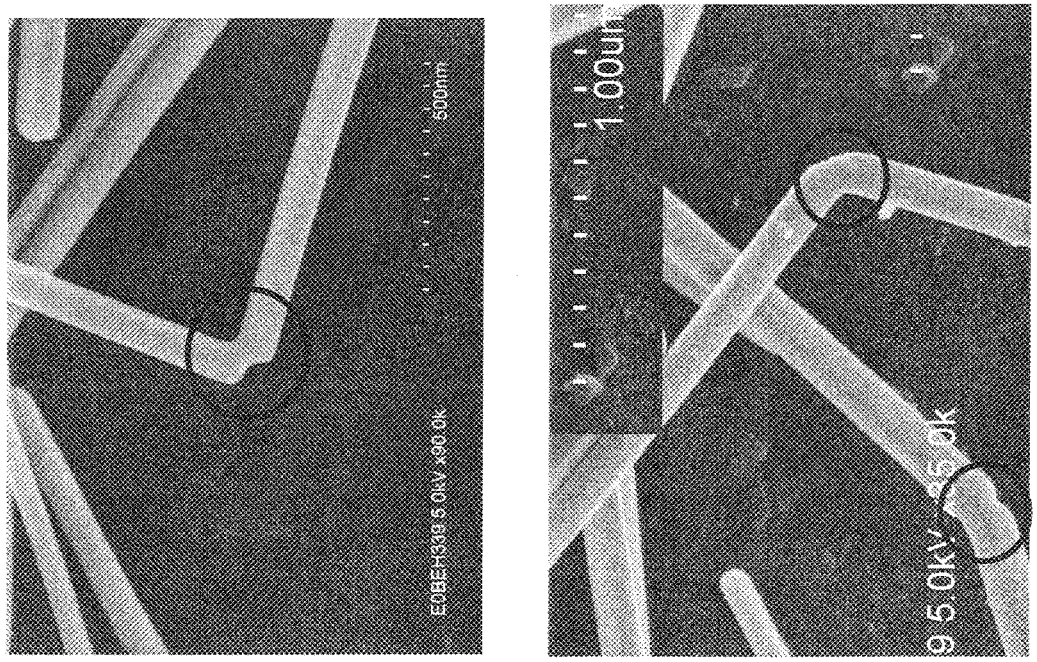

METAL NANOWIRE NETWORKS AND TRANSPARENT CONDUCTIVE MATERIAL

CROSS REFERENCE TO RELATED APPLICATION

This application is a divisional of co-pending U.S. patent application Ser. No. 13/530,822, to Virkar et al., filed on Jun. 22, 2012, entitled "METAL NANOWIRE NETWORKS AND TRANSPARENT CONDUCTIVE MATERIAL," which is incorporated herein by reference.

FIELD OF THE INVENTION

The invention relates to fused networks of metal nanowires that are suitable for the formation of electrically conductive and transparent films, such as for use as transparent electrodes. The inventions are further related to chemical methods for fusing the nanowires to form networks as well as to devices incorporating the fused metal nanowire networks.

BACKGROUND

Functional films can provide important functions in a range of contexts. For example, electrically conductive films can be important for the dissipation of static electricity when static can be undesirable or dangerous. Optical films can be used to provide various functions, such as polarization, anti-reflection, phase shifting, brightness enhancement or other functions. High quality displays can comprise one or more optical coatings.

Transparent conductors can be used for several optoelectronic applications including, for example, touch-screens, liquid crystal displays (LCD), flat panel display, organic light emitting diode (OLED), solar cells and smart windows. Historically, indium tin oxide (ITO) has been the material of choice due to its relatively high transparency at high conductivities. There are however several shortcomings with ITO. For example, ITO is a brittle ceramic which needs to be deposited using sputtering, a fabrication process that involves high temperatures and vacuum and therefore is relatively slow and not cost effective. Additionally, ITO is known to crack easily on flexible substrates.

SUMMARY OF THE INVENTION

In a first aspect, the invention pertains to a material that comprises a transparent conductive coating and a substrate on which the coating is supported. The coating has fused metal nanowire networks that comprise fused metal nanowires. The coating in general has a transparency to visible light of at least about 85% and a sheet resistance of no more than about 100 Ohms/square or a transparency to visible light of at least about 90% and a sheet resistance of no more than about 250 Ohms/square. In some embodiments, the metal nanowires have an aspect ratio from about 50 to about 5000 and a diameter of no more than about 250 nm. In additional embodiments, the metal nanowires have an aspect ratio from about 100 to about 2000 and a diameter from about 10 nm to about 120 nm. The metal nanowires can comprise silver, copper, gold, indium, tin, iron, titanium, platinum, palladium, nickel, cobalt, or an alloy combination thereof. In some embodiment, the metal nanowire comprises silver nanowires. The metal nanowires on the substrate can have a surface loading level that is about 0.1 μg/cm$^2$ to about 5 mg/cm$^2$. The substrate used can be glass, polymer, inorganic semiconducting material, inorganic dielectric material, laminates thereof, composites thereof or combinations thereof. In some embodiments, polymeric substrate used can be polyethylene terephthalate (PET), polyacrylate, polyolefin, polyvinyl chloride, fluoropolymer, polyamide, polyimide, polysulfone, polysiloxane, polyetheretherketone, polynorbornene, polyester, polyvinyl alcohol, polyvinyl acetate, acrylonitrile-butadiene-styrene copolymer, polycarbonate, a copolymer thereof or blend thereof. In some embodiments, the material further comprises a polymer film overcoat. In some embodiment, the material has a sheet resistance of no more than about 75 ohm/sq and a transparency of at least about 85% at 550 nm. In other embodiments, the material has a sheet resistance of no more than about 175 ohm/sq and a transparency of at least about 90% at 550 nm.

In a second aspect, the invention pertains to a method of forming a transparent, electrically conductive film. The method comprises the steps of depositing a plurality of metal nanowires as a coating on a surface of a substrate to form a pre-treatment material; and exposing the pre-treatment material to a vapor fusing agent for no more than about 4 minutes to fuse at least some of the metal nanowires together to form the transparent electrically conductive film that comprises fused metal nanowire network. The fusing agent can be a solution of HCl, HBr, HF, LiCl, NaF, NaCl, NaBr, NaI, KCl, MgCl$_2$, CaCl$_2$, AlCl$_3$, NH$_4$Cl, NH$_4$F, AgF, or a combination thereof. The solution can have a halide ion concentration from about 0.1 mM to about 10 M in a polar solvent, an alcohol, and or water solvent. In some embodiment, the fusing agent can be vapor of HCl, HBr, HF, HI or combinations thereof. The exposing to the fusing agent step of the method in general is performed for no more than about 3 minutes. Metal nanowires comprises silver, copper, gold, tin, iron, titanium, indium, platinum, palladium, nickel, cobalt, or an alloy combination thereof can be used in the method. In some embodiment, the silver nanowires is used to form the film. The metal nanowires on the substrate can have a surface loading level that is about 0.1 μg/cm$^2$ to about 5 mg/cm$^2$. In some embodiments, the fused metal nanowire network of the film has a transparency to visible light at 550 nm of at least about 85% and a sheet resistance of no more than about 100 Ohms/square. In other embodiments, the fused metal nanowire network has a transparency to visible light at 550 nm of at least about 90% and a sheet resistance of no more than about 250 Ohms/square.

In a third aspect, the invention pertains to a method of forming a transparent electrically conductive film. The method comprises the steps of depositing a dispersion of metal nanowires onto a substrate surface, delivering a solution comprising a fusing agent in a solvent onto the substrate surface; and drying the substrate surface after depositing the metal nanowires and delivering the fusing agent solution to fuse at least some of the metal nanowires into the transparent electrically conductive film comprising a fused metal nanowire network. The fusing agent comprises HCl, HBr, HF, LiCl, NaF, NaCl, NaBr, NaI, KCl, MgCl$_2$, CaCl$_2$, AlCl$_3$, NH$_4$Cl, NH$_4$F, AgF, or a combination thereof. The solution of the fusing agent has a halide ion concentration from about 0.1 mM to about 10 M and a solvent that comprises an alcohol, water, or a combination thereof. In some embodiment, the metal nanowire dispersion further comprises the fusing agent such that the depositing of the nanowire dispersion and the fusing agent solution are performed simultaneously. In some embodiment, the delivering of the fusing agent solution is performed after depositing the metal nanowire dispersion. Metal nanowires comprises silver, copper, gold, tin, iron, titanium, indium, platinum, palladium, nickel, cobalt, or an alloy combination thereof can be used in the method. In some embodiment, the silver nanowires is used to form the film. The metal nanowires on the substrate can have a surface loading level that is about 0.1 μg/cm$^2$ to about 5 mg/cm$^2$. In some embodiments, the fused metal nanowire network of the film has a transparency to visible light at 550 nm of at least about 85% and a sheet resistance of no more than about 100 Ohms/square. In other embodiments, the fused metal nanowire network has a transparency to visible light at 550 nm of at least about 90% and a sheet resistance of no more than about 250 Ohms/square.

In a fourth aspect, the invention pertains to a device that comprises at least one transparent electrode that uses a transparent conductive material comprising a fused metal nanowire network described herein.

BRIEF DESCRIPTION OF THE DRAWINGS

FIG. 7 is SEM micrographs of fused silver nanowires after HCl vapor treatment.

DETAILED DESCRIPTION OF PREFERRED EMBODIMENTS

Figure 1B:
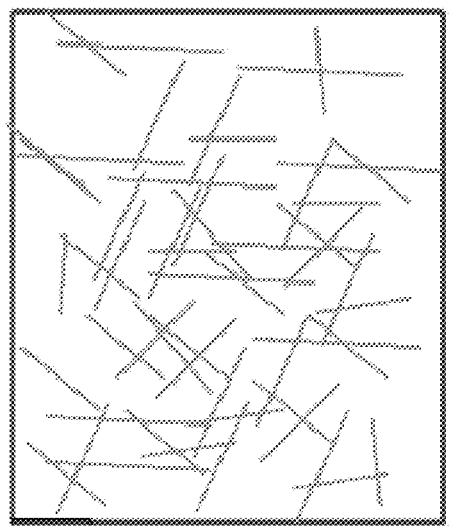
FIG. 1B is a schematic drawing of a nanowire (NW) based transparent conductive material fabricated from low cost solution processable methods disclosed herein.

A fused metal nanowire network can be formed chemically to achieve a structure with desirably low electrical resistance and high transparency to visible light. The fused metal nanowire network can be formed as a coating for use as a transparent conductive layer. Silver nanowire can be a convenient material to form the network, but other metal nanowires are also suitable for forming the network of fused metal nanowires. The chemical fusing can be performed using gas phase or solution phase ionic inorganic compositions with halogen anions. Since the electrically conductive network can be formed at low temperature, the networks are suitable for use with materials, such as polymers, that cannot tolerate high temperatures. Thus, the conductive networks are well suited to certain transparent electrode applications and the low quantities of materials and low temperature processing can provide for convenient commercial applications.

Metal nanowires can be formed from a range of metals. For example, the production of a range of metal nanowires is described, for example, in U.S. Patent Application Publication No. 2010/0078197 to Miyagishima et al., entitled "Metal Nanowires, Method for Producing the Same, and Transparent Conductor," incorporated herein by reference. There has been particular interest in silver nanowires due to the high electrical conductivity of silver. With respect to the specific production of silver nanowires, see for example, U.S. Patent Application Publication No. 2009/0242231 to Miyagisima et al., entitled "Silver Nanowire, Production Methods Thereof, and Aqueous Dispersion," and U.S. Patent Application Publication No. 2009/0311530 to Hirai et al., entitled "Silver Nanowire, Production Method Thereof, and Aqueous Dispersion," and U.S. Pat. No. 7,922,787 to Wang et al., "Methods for the Production of Silver Nanowires," all three of which are incorporated herein by reference. Silver nanowires are commercially available, for example, from Seashell Technologies, LLC, CA, USA.

Silver is known to have a bulk melting point of about 960° C. However, nanoparticles of silver can melt at temperatures less than 150° C. This melting point depression observed for the nanoparticles are believed to be based on the large surface area/volume ratios of the nanoparticles. In general, the larger the surface area/volume ratio, the greater the expected mobility of the surface atoms, and the lower the melting point. Melting points of about 150° C. for silver nanoparticles however may still be too high for a variety of substrates including plastics and elastomers. The time required for melting and cooling can also be in excess of several minutes, which add time and process costs to production.

To produce flexible transparent conductive material that can be produced at reasonable cost and in large scale such as roll-to-roll coating or ink-jet printing method, numerous new materials have been developed as replacements for indium tin oxide (ITO). A potential ITO replacement is a metal-grid shown in FIG. 1A. Metal grids, which can be formed using patterning approaches such as photolithography, can achieve very high performances with low sheet resistances. However, the metal grid films are not solution-processable for example with roll-to-roll coating and therefore are costly to fabricate and often involve fabrication methods which are difficult to scale. While the performance of metal grids may exceed ITO, cost and processability are still hindering their wide-spread adoption.

Figure 1A:
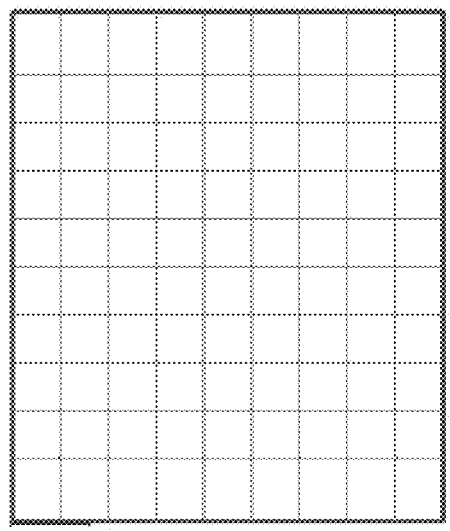
FIG. 1A is a schematic drawing of metal grid based transparent electrode formed through a traditional patterning approach.

As shown schematically in FIG. 1B, the metal nanowires deposited into a film from a dispersion can appear to be randomly arrayed rods that intersect with each other randomly, although in practice some alignment of rods can take place depending on the deposition process. While metal nanowires are inherently electrically conducting, the vast majority of resistance in the silver nanowires based films is believed to due to the junctions between nanowires. To improve the properties, it has been proposed to embed the metal nanowires in a secondary electrically conductive medium, see published U.S. patent application 2008/0259262 to Jones et al., entitled "Composite Transparent Conductors and Methods of Forming the Same," incorporated herein by reference. In principle, the junction resistance of a AgNW network can be reduced by sintering or fusing the wires together using heat as disclosed in "Modeling the melting temperature of nanoparticles by an analytical approach." by A. Safaei et. Al. in J. Phys. Chem. C, 2008, 112, 99-105 and in "Size effect on thermodynamic properties of silver nanoparticles" by W. Luo et al. in J. Phys. Chem. C, 2008, 112, 2359-69. The heat can be applied conventionally or by a light source. However, conventional heating may not be practical for many applications since the NWs are not expected to melt until 300-400° C., which is significantly greater than the thermal stability limits of most plastic substrates. Light sources can also be used, but may involve setup of additional and expensive equipment in a large roll-to-roll fabrication. A room or low temperature process which fuses the NWs is therefore highly desirable. Hu et al. disclosed similar results in ACS Nano, Vol 4, No. 5, 2010, 2955-2963 entitled "Scalable coating properties of flexible, silver nanowire electrodes." Hu et al demonstrated that the junction resistance between the silver nanowires can be in the giga-ohm range, but with processing to 110° C. with the optional addition of significant pressures for short times improved electrical conductivity performance could be obtained.

Low temperature in combination with the application of pressure has been used to achieve a significant decrease in electrical resistance while reasonable levels of transparency were reported. See, De et al., "Silver Nanowire Networks as Flexible, Transparent Conducting Films: Extremely High DC to Optical Conductivity Ratio," ACS Nano Vol. 3(7), pp 1767-1774 (June 2009). The De et al. article does not suggest that fusing of the silver nanowires takes place, and the low temperature used in the process would seem to be too low to result in fusing. The process in the De et al. article involved vacuum filtering and transfer using 100° C. and significant amounts of pressure for 2 hours. This process is not desirable from a commercial processing perspective.

As described herein metal nanowires are fused at room temperature for transparent conductive material applications using a chemical approach. Silver nanowires in particular has been found can be fused together to improve the sheet resistance of the film formed from the $10^5$-$10^8$ Ω/sq range to the 10 to 100 Ω/sq range with less than 0.5% changes to the transparency. Nanowire network thicknesses can be used that provide overall good transparency of at least about 85% for networks with the reported low electrical resistance. The fusing can be achieved in less than a minute that impose little or no change or damage to the morphology of the metal nanowires. Thus, the process is well suited to efficient and relatively inexpensive commercial processing.

It was recently demonstrated by Magdassi and co-workers that thick films of silver nanoparticles (AgNPs) can be "sintered" at room temperature using various chemical agents for non-transparent patterned silver paste application. A process for the chemical fusing of metal nanoparticles is described in published PCT application WO 2010/109465 to Magdassi et al., entitled "Process for Sintering Nanoparticles at Low Temperatures," incorporated herein by reference. The nanoparticle low temperature sintering is further described in Grouchko et al., "Conductive Inks with a "Built-In" Mechanism That Enables Sintering at Room Temperature," ACS Nano Vol. 5 (4), pp. 3354-3359 (2011). The fusing of nanoparticles forms a sheet of metal, which can have a desired low electrical resistance, but the sheet of metal generally does not have desired amounts of transparency.

A vapor based process for the formation of a conductive film from silver nanowires is described in Liu et al., "Silver Nanowire-Based Transparent, Flexible and Conductive Thin Film," Nanoscale Research Letters, Vol. 6(75), 8 pages (January 2011) (hereinafter "the Liu article"). The films formed as described in the Liu article had reasonably low electrical resistance, but the transparency of the films was not satisfactory for many applications. The Liu article attributed their observations to the removal of surface oxidation from the silver nanowires. However, significant deterioration of the nanowire morphology has been observed in the micrographs shown in the Liu article. Improved processing leads to significantly improved results for the fused metal nanowire networks described herein. In particular, desired levels of fusing have been achieved with short time processing of the nanowires with the halide anions without degrading the level of optical transparency and with little deterioration of the nanowire morphology.

For transparent electrode applications, higher-aspect ratio structures like wires or tubes are advantageous since the rod like shape can promote electrical conductivity primarily in-plane. The primarily in-plane conductivity in these rod-like structures allows for "open" areas and thin films which are useful for high light transmission and good 2D sheet conductivities. Nanowires (NWs) are particularly good candidates for transparent conductor applications. However due to their much larger size of about 10 s of nanometers in diameter and 10 s-100 s of microns in length, the surface area/volume ratio of nanowires is considerably smaller than NPs. Silver NWs for example typically do not melt until temperatures of about 300-400° C. Silver nanowires are $10^4$-$10^5$ times larger in volume relative to nanoparticles and have much smaller ratio of surface area to volume and ratio of surface atoms to bulk atoms. The significant differences in physical size of nanowires relative to nanoparticles imply that the properties are likely to be correspondingly different.

The improved fused metal nanowire networks described herein can achieve simultaneously desirably low sheet resistance values while providing good optical transmission. In some embodiments, the fused metal nanowire networks can have optical transmission at 550 nm wavelength light of at least 85% while having a sheet resistance of no more than about 100 ohms/square. In additional or alternative embodiments, the fused metal nanowire networks can have optical transmission at 550 nm of at least 90% and a sheet resistance of no more than about 250 ohms/sq. Based on the ability to simultaneously achieve good optical transparency and low sheet resistance, the fused metal nanowire films can be used effectively as transparent electrodes for a range of applications. The loading of the nanowires to form the network can be selected to achieve desired properties.

Figure 1D:
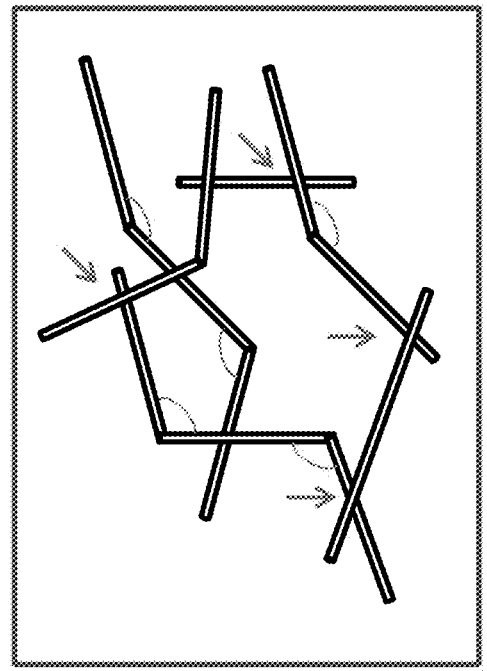
FIG. 1D is a schematic drawing illustrating nanowires being fused together to form a fused NW based transparent conductive material with angles around the fused points and arrows indicating the formation of NW network.
Figure 1C:
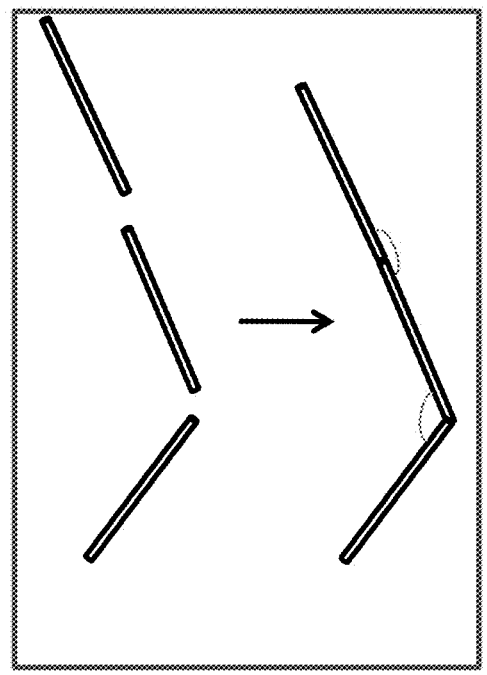
FIG. 1C is a schematic drawing illustrating the process of three nanowires being fused together to form an elongated nanowire with two angles around the fused points.

To achieve the desirable properties of the fused metal nanowire networks, it was surprisingly discovered that short time exposure of silver nanowires to halide containing fusing agents could dramatically improve the conductivity of the nanowire networks or films. In general, the metal nanowire networks can be exposed to the fusing agent for times of no more than about 4 minutes to cause the desired fusing, and in some embodiments significantly less time can be used as described further below. The dramatic reduction in sheet resistance may partially be attributed to the removal of the insulating capping polymer polyvinylpyrrolidone (PVP) that is used to stabilize commercial silver nanowires, but is believed to be primarily related to the fusing of the nanowires. SEM studies of the treated silver nanowires indicated clearly the formation of fusing points between the nanowires that are in close proximity of each other as well as significantly reduced amount of detectable PVP polymer. In comparison, the SEM of the untreated silver nanowires clearly shows the presence of PVP polymer and the gap between the ends of the closely situated silver nanowires. Referring to FIG. 1C, a schematic diagram illustrating the process of the ends of three adjacent nanowires being fused together is shown. The fused nanowires form an elongated nanowire with two angles around the fused points. Elongated nanowires can further form a network of elongated nanowires as shown in FIG. 1D, with angles around the fused ends and arrows indicating the connection formation between the elongated nanowires to form the nanowire network.

The fused silver nanowires disclosed herein have considerable differences from the sintered silver nanoparticles disclosed by Magdassi and the treated silver nanowires disclosed by Liu. Specifically, after the sintering process, the AgNPs of Magdassi aggregated together. The profiles of the individual AgNPs that existed prior to the sintering process have been destroyed considerably during the sintering process to form the aggregates. The word sintering indeed is a proper description of the melting and coalescing, and or coarsening of the silver nanoparticles of Magdassi. With regard to the treatment of silver nanowires proposed by Liu, although Liu intended to improve conductivity of the silver nanowires by removal of AgO, the prolonged HCl treatment disclosed by Liu caused observable thinning and shortening of the silver nanowires that seems to have degraded the properties of the resulting material.

In contrast to the processing approach described by Magdassi et al., the current processing approach is directed to the production of networks with a high level of optical transparency. The processing conditions are designed to achieve this objective, and the nanowire morphology is conducive to processing to obtain a desired degree of transparency. In particular, conductive films can have an optical transparency evaluated for convenience at 550 nm light wavelength of at least about 85%.

The processing of the metal nanowire networks described herein comprises the contact of a thin metal nanowire layer, i.e., a network, with a chemical fusing agent comprising a halide anion. The fusing agent can be delivered as a vapor or in solution. For example, acid halides are gaseous and can be delivered in a controlled amount from a gas reservoir or as vapor from a solution comprising the acid halide. Halide salts can be dissolved in solution with a polar solvent with a moderate concentration, and a quantity of the salt solution can be contacted with the nanowire network to fuse adjacent nanowires. Suitable solvents for forming a solution with the chemical fusing agent include, for example, alcohols, ketones, water, or a combination thereof. It has been discovered that superior properties of the fused network results from short processing times for the nanowire network with the fusing agent. The short processing times can be successful to achieve very low levels of sheet resistance while maintaining high optical transparency.

While the processing conditions are designed to produce good optical transparency, the metallic grid-like properties of the fused elongated silver nanowires dramatically increased conductivity with little change in transparency relative to the unfused networks. The drop in electrical resistance may be due to a drop in junction resistance between adjacent nanowires due to fusing of the adjacent nanowires. The treatment described herein may also have improved the connection between the other connecting points indicated by the arrows in FIG. 1D by removing oxidation layer of the nanowires, by removing the capping agent such as PVP of the nanowires, or by at least partially fusing these connection point together. Although removal of the PVP from the surface of silver nanowires have been observed in the examples below, fusing of the silver nanowires at points of contact can also be observed. The final transparent conductive material can best be described as a fused network of silver nanowires, as illustrated in FIG. 1D. The fused metal nanowire network structure has advantages over conventional metal grids described in FIG. 1A due to low cost fabrication methods and solution processability.

In summary, a highly conductive and transparent material was formed at room temperature by fusing the ends of silver nanowires to improve the conductivity without sacrifice the transparency. The resulting material appears to be a silver metallic grid like structure that is highly conductive. The examples below described using HCl as the fusing agent from the vapor phase, dilute solutions of HCl, NaCl, and AgF were also used to create the materials of comparable properties at room temperature. It is understood the metal nanowires could be treated multiple times to achieve the desired degree of fusing, with the same or different fusing agent during each treatment. Although silver nanowires were used to perform the fusing experiments, it is understood that other metal nanowires can be similarly fused together to form materials with improved conductivity.

Electrically Conductive Film Structure and Properties

The conductive films described herein generally comprise a substrate and a fused metal nanowire network deposited on the substrate. An optional polymer coating can be placed over the metal nanowire network to protect and stabilize the fused nanowire network. The parameters of the metal nanowires can be adjusted to achieve desirable properties for the fused network. For example, a higher loading of nanowires can result in a lower electrical resistance, but transparency can decrease with a higher nanowire loading. Through a balance of these parameters, desirable levels of electrical conductivity and optical transparency can be achieved. The nanowires in the improved networks are fused, as is observed in scanning electron micrographs. It is believed that the fusing of the nanowires results in the improved electrical conductivity while maintaining high levels of optical transparency. Having a network with fused nanowires should provide a stable electrically conductive structure over a reasonable lifetime of a corresponding product.

In general, the nanowires can be formed from a range of metals, such as silver, gold, indium, tin, iron, cobalt, platinum, palladium, nickel, cobalt, titanium, copper and alloys thereof are desirable due to high electrical conductivity. Silver in particular provides excellent electrical conductivity, and commercial silver nanowires are available. To have good transparency, it is desirable for the nanowires to have a small range of diameters. In particular, it is desirable for the metal nanowires to have an average diameter of no more than about 250 nm, in further embodiments no more than about 150 nm, and in other embodiments from about 10 nm to about 120 nm. With respect to average length, nanowires with a longer length are expected to provide better electrical conductivity within a network. In general, the metal nanowires can have an average length of at least a micron, in further embodiments, at least 2.5 microns and in other embodiments from about 5 microns to about 100 microns, although improved synthesis techniques developed in the future may make longer nanowires possible. An aspect ratio can be specified as the ratio of the average length divided by the average diameter, and in some embodiments, the nanowires can have an aspect ratio of at least about 25, in further embodiments from about 50 to about 5000 and in additional embodiments from about 100 to about 2000. A person of ordinary skill in the art will recognize that additional ranges of nanowire dimensions within the explicit ranges above are contemplated and are within the present disclosure.

As noted above the amount of nanowires delivered onto the substrate can involve a balance of factors to achieve desired amounts of transparency and electrical conductivity. While thickness of the nanowire network can in principle be evaluated using scanning electron microscopy, the network can be relatively fragile, which can complicate the measurement. In general, the fused metal nanowire network would have an average thickness of no more than about 5 microns. However, the fused nanowire networks are generally relatively open structures with significant surface texture on a submicron scale, and only indirect methods can generally be used to estimate the thickness. The loading levels of the nanowires can provide a useful parameter of the network that can be readily evaluated, and the loading value provides an alternative parameter related to thickness. Thus, as used herein, loading levels of nanowires onto the substrate is presented as microgram or milligrams of nanowires for a square centimeter of substrate. In general, the nanowire networks can have a loading from about 0.1 microgram/cm$^2$ to about 5 milligrams (mg)/cm$^2$, in further embodiments from about 1 microgram/cm$^2$ to about 2 mg/cm$^2$, and in other embodiments from about 5 microgram g/cm$^2$ (μg/cm$^2$) to about 1 mg/cm$^2$. A person of ordinary skill in the art will recognize that additional ranges of thickness and loading within the explicit ranges above are contemplated and are within the present disclosure.

Electrical conductivity can be expressed as a sheet resistance, which is reported in units of ohms per square (Ω/□ or ohms/sq) to distinguish the values from bulk electrical resistance values according to parameters related to the measurement process. Sheet resistance of films is generally measured using a four point probe measurement or an equivalent process. In the Examples below, film sheet resistances were measured using a four point probe, or by making a square using a quick drying silver paste. The fused metal nanowire networks can have a sheet resistance of no more than about 200 ohms/sq, in further embodiments no more than about 100 ohms/sq, and in other embodiments no more than about 60 ohms/sq. A person of ordinary skill in the art will recognize that additional ranges of sheet resistance within the explicit ranges above are contemplated and are within the present disclosure. In general, sheet resistance can be reduced by increasing the loading of nanowires, but an increased loading may not be desirable from other perspectives as described further below, and the loading is not as significant as achieving good fusing for improving the sheet resistance.

For applications as transparent conductive films, it is desirable for the fused metal nanowire networks to maintain good optical transparency. In general, optical transparency is inversely related to the loading, although processing of the network can also significantly affect the transparency. The optical transparency can be evaluated relative to the transmitted light through the substrate. For example, the transparency of the conductive film described herein can be measured by using a UV-Visible spectrophotometer and measuring the total transmission through the conductive film and support substrate. Transmittance is the ratio of the transmitted light intensity (I) to the incident light intensity (I$_o$). The transmittance through the film (T$_{film}$) can be estimated by dividing the total transmittance (T) measured by the transmittance through the support substrate (T$_{sub}$). (T=I/I$_o$ and T/T$_{sub}$=(I/I$_o$)/(I$_{sub}$/I$_o$)=I/I$_{sub}$=T$_{film}$) While it is generally desirable to have good optical transparency across the visible spectrum, for convenience, optical transmission is reported herein at 550 nm wavelength of light. In some embodiments, the film formed by the fused network has a transmission at 550 nm of at least 80%, in further embodiments at least about 85% and in additional embodiments, at least about 90%. As noted above, the correlation of good optical transparency with low electrical resistance can be particularly desirable. In some embodiments with a sheet resistance from 20 ohm/sq to about 150 ohm/sq, the films can have an optical transmission at 550 nm of at least about 86%, in further embodiments at least about 88% and in other embodiments from about 89% to about 92%. In one embodiment, the film can have a sheet resistance of no more than about 75 ohm/sq and a transparency of at least about 85% at 550 nm. In another embodiment, the film can have a sheet resistance of no more than about 175 ohm/sq and a transparency of at least about 90% at 550 nm. A person or ordinary skill in the art will recognize that additional ranges of optical transmission within the explicit ranges above are contemplated and are within the present disclosure.

As described in the Examples below, the processing approaches described herein result in the fusing of the metal nanowires. This fusing is believed to contribute to the enhanced electrical conductivity observed and to the improved transparency achievable at low levels of electrical resistance. The fusing is believed to take place at points of near contact of adjacent nanowires during processing. Thus, fusing can involve end-to-end fusing, side wall to side wall fusing and end to side wall fusing. The degree of fusing may relate to the processing conditions. As described further below, short processing times are believed to contribute good fusing without degradation of the nanowire network.

In general, suitable substrates can be selected as desired based on the particular application. Substrate surfaces can comprise, for example, polymers, glass, inorganic semiconductor materials, inorganic dielectric materials, polymer glass laminates, composites thereof, or the like. Suitable polymers include, for example, polyethylene terephthalate (PET), polyacrylate, polyolefins, polyvinyl chloride, fluoropolymers, polyamides, polyimide, polysulfones, polysiloxanes, polyetheretherketones, polynorbornenes, polyester, polyvinyl alcohol, polyvinyl acetate, acrylonitrile-butadiene-styrene copolymer, polycarbonate, copolymers thereof, mixtures thereof and the like. Furthermore, the material can have a polymer overcoat placed on the fused metal nanowire network, and the overcoat polymers can comprise the polymers listed for the substrates above. Moreover, other layers can be added on top or in between the conductive film and substrate to reduce reflective losses and improve the overall transmission of the stack.

Processing of Nanowire Networks

The improved electrical conductivity and optical transparency has been found to be obtained with short time treatment of as deposited metal nanowire films with compounds comprising halogen anions. Desirable increases in electrical conductivity have been achieved with both vapor delivery of the fusing composition or with solution based delivery. The fusing achieves low electrical surface resistance while maintaining high levels of optical transmission.

The formation of the metal nanowire network comprises the formation of a dispersion of the metal nanowires in a suitable liquid and applying the dispersion as a coating onto the selected substrate surface. The concentration of the dispersion can be selected to obtain a good dispersion of the nanowires to provide for a desired degree of uniformity of the resulting coating. In some embodiments, the coating solution can comprise from about 0.1 wt % to about 5.0 wt % metal nanowires, and in further embodiments from about 0.25 wt % to about 2.5 wt % metal nanowires. A person of ordinary skill in the art will recognize that additional ranges of metal nanowire concentrations within the explicit ranges above are contemplated and are within the present disclosure. Similarly, the liquid for forming the dispersion can be selected to achieve good dispersion of the nanowires. For example, alcohols, such as ethanol or isopropyl alcohol, ketone based solvents, such as methyl ethyl ketone, organic coating solvents, such as toluene or hexane, or the like or mixtures thereof, are generally good dispersants for metal nanowires.

Any reasonable coating approach can be used, such as dip coating, spray coating, knife edge coating, bar coating, Meyer-rod coating, slot-die, gravure, spin coating or the like. After forming the coating with the dispersion, the nanowire network can be dried to remove the liquid. The dried film of metal nanowires can then be processed to achieve nanowire fusing.

A first approach to fusing can be performed with acid halide vapor, such as vapor from HCl, HBr, HI or mixtures thereof. HF can also be used, but HF may be corrosive to some substrate materials and is more toxic. Specifically, the dried coating can be exposed to the vapor of the acid halide for a brief period of time. The hydrogen halide compounds are gaseous and are soluble in water and other polar solvents such as alcohol. Generally, the vapor for fusing the metal nanowire film can be generated from a gas reservoir or from vapor given off by solutions of the hydrogen halide compounds. Acidic vapors can quickly be passed over the coating surfaces for example for about 10 s to form the nanowire network. In general, the coating containing the nanowires can be treated with acid vapor for no more than about 4 minutes, in further embodiments for from about 2 seconds to about 3.5 minutes and in other embodiments from about 5 seconds to about 3 minutes. A person of ordinary skill in the art will recognize that additional ranges of treatment times are contemplated and are within the present disclosure.

In further embodiments, the initial metal nanowires can be fused with a solution comprising halide anions. In particular, the solution comprising dissolved acid halide, dissolved metal halide salts or a combination thereof. Suitable compositions for forming the halide solutions include, for example, HCl, HBr, HF, LiCl, NaF, NaCl, NaBr, NaI, KCl, $MgCl_2$, $CaCl_2$, $AlCl_3$, $NH_4Cl$, $NH_4F$, AgF, or a combination thereof. In particular NaCl, NaBr, and AgF provide particularly desirable fusing properties. In general, the halide fusing solution can be added to a previously formed coating comprising the metal nanowires to fuse the metal nanowires. Additionally or alternatively, the halide composition can be combined with the metal nanowire dispersion that is then deposited as a coating so that the metal nanowires and the fusing agent are simultaneously deposited. If the fusing agent is included with the metal nanowires in the metal nanowire dispersion, a separate fusing solution can also be delivered onto the metal nanowire coating to add an additional quantity of fusing agent.

The solutions for separate application of the fusing agent generally comprise halide ions at concentrations of at least about 0.01 mM, in some embodiments, from about 0.1 mM to about 10 M, in further embodiments from about 0.1 M to about 5 M. The metal nanowires can be contacted with the halide solution using any reasonable approach such as dip coating, spraying, or the like. Alternatively or additionally, the halide salt or acid can be added directly to a dispersant of nanowires in ranges from 0.01 mM to about 1 M to form a nanowire and halide mixture. The mixture is then coated onto the substrate surface as described above to form a coating. The film formation process then results in the direct formation of the film with the fusing agent already present. Whether the solution comprising halide anions is delivered with the metal nanowire coating solution, with a separate fusing solution or both, the nanowires in the coating form fused nanowire networks upon solvent removal and the saturation of the halide ions. Formation of the nanowire network is complete when the solvent is completely removed from the coating to form a dry film, and while not wanting to be limited by theory, the fusing process is believed to be related to the concentration of the halide anions during the drying process. A person of ordinary skill in the art will recognize that additional ranges of concentration within the explicit ranges above are contemplated and are within the present disclosure.

After completing the fusing process, the fused metal nanowire networks are ready for any additional further processing to form the final product. For example, the coating or film containing the metal nanowire networks may be rinsed to remove unreacted sintering agents, and/or may be encapsulated with a protective coating. Due to the high transparency with low electrical resistance, the fused nanowire networks are well suited for the formation of transparent conductive electrodes, transparent composites, which can be used for solar cells, displays, touch screens, solar windows, capacitive switches, and the like.

EXAMPLES

Silver nanowires with different sizes purchased from either ACS Materials or Seashell Technology, LLC (CA, USA) were used in the following examples. The properties of the silver nanowires were an average diameter of 60 nm and an average length of 10 microns or an average diameter of 115 nm and an average length of 30 microns.

Example 1—Fabrication of Transparent Conductive Material Using HCl Vapor Treatment This example demonstrates the ability to use a vapor based fusing agent to chemically drive the fusing of silver nanowires to dramatically improve the electrical conductivity.

Commercially available silver nanowires (AgNWs) were dispersed in alcohols e.g. ethanol or isopropanol to form an AgNWs dispersion. The AgNWs dispersions were typically in the 0.1-1.0% wt range. The dispersion was then deposited on glass or polyethylene terephthalate (PET) surfaces as an AgNWs film using a spray coating or a hand-drawn rod approach. The AgNWs film was then exposed briefly to HCl vapour as a fusing agent. Specifically, the AgNWs film was exposed to HCl vapour from a concentrated HCl solution at room temperature for about 10 seconds. AgNWs from two different vendors were used. The sheet resistance and transparency of the AgNWs film before and after the treatment with HCl vapour were measured and recorded. The data of AgNWs from the first vendor is listed in Table 1 and the date of AgNWs from the second vender is listed in Table 2 below.

TABLE 1

| Sample No. | Sheet Resistance Before HCl (ohm/sq) | Sheet Resistance After HCl (ohm/sq) |
| --- | --- | --- |
| 1 | 10000000 | 660 |
| 2 | 83000 | 60 |
| 3 | 10000000 | 1909 |
| 4 | 10000000 | 451 |
| 5 | 800000 | 113.4 |
| 6 | 695000 | 30 |
| 7 | 10000000 | 62 |

TABLE 1-continued

| Sample No. | Sheet Resistance Before HCl (ohm/sq) | Sheet Resistance After HCl (ohm/sq) |
|---|---|---|
| 8 | 399000 | 562 |
| 9 | 14,200 | 53.4 |
| 10 | 10000000 | 283 |
| 11 | 10000000 | 1260 |
| 12 | 10000000 | 364 |
| 13 | 10000000 | 6700 |
| 14 | 10000000 | 1,460 |
| 15 | 10000000 | 70.5 |
| 16 | 10000000 | 2280 |
| 17 | 10000000 | 155 |
| 18 | 10000000 | 1654 |
| 19 | 10000000 | 926 |

TABLE 2

| Sample | Sheet Resistance Before HCl (ohm/sq) | Sheet Resistance After HCl (ohm/sq) |
|---|---|---|
| 1 | 13180 | 253 |
| 2 | 6200000 | 244 |
| 3 | 6030 | 115 |
| 4 | 32240 | 43.6 |
| 5 | 4300000 | 68.3 |
| 6 | 10000000 | 1060 |
| 7 | 10000000 | 47.5 |
| 8 | 3790 | 61.7 |
| 9 | 4690 | 42.4 |
| 10 | 404 | 37.5 |

Figure 2:
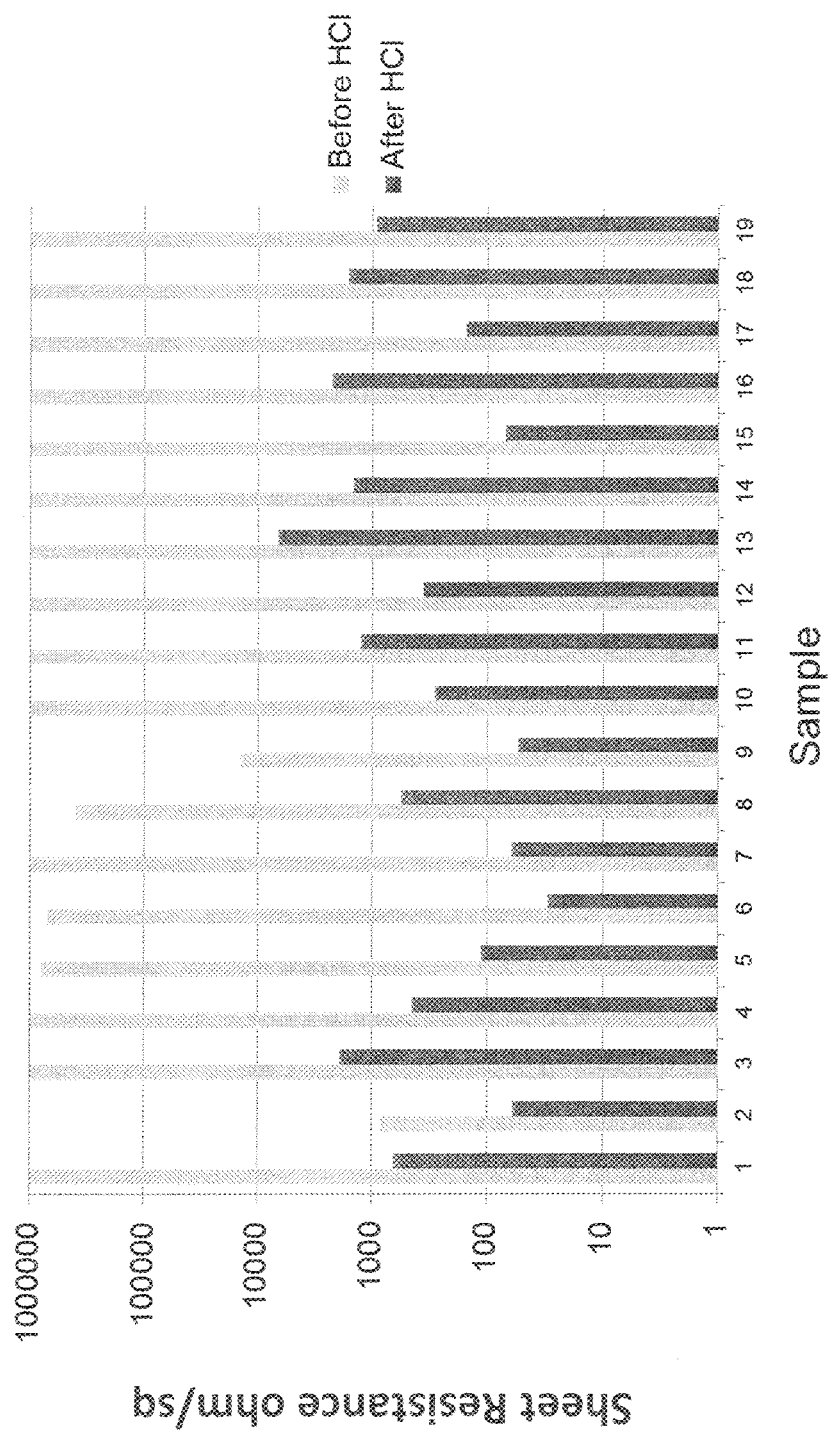
FIG. 2 is a plot of sheet resistance of the samples from the first vendor tested before and after the HCl vapor treatment having a transparency at 550 nm greater than 75%.
Figure 3:
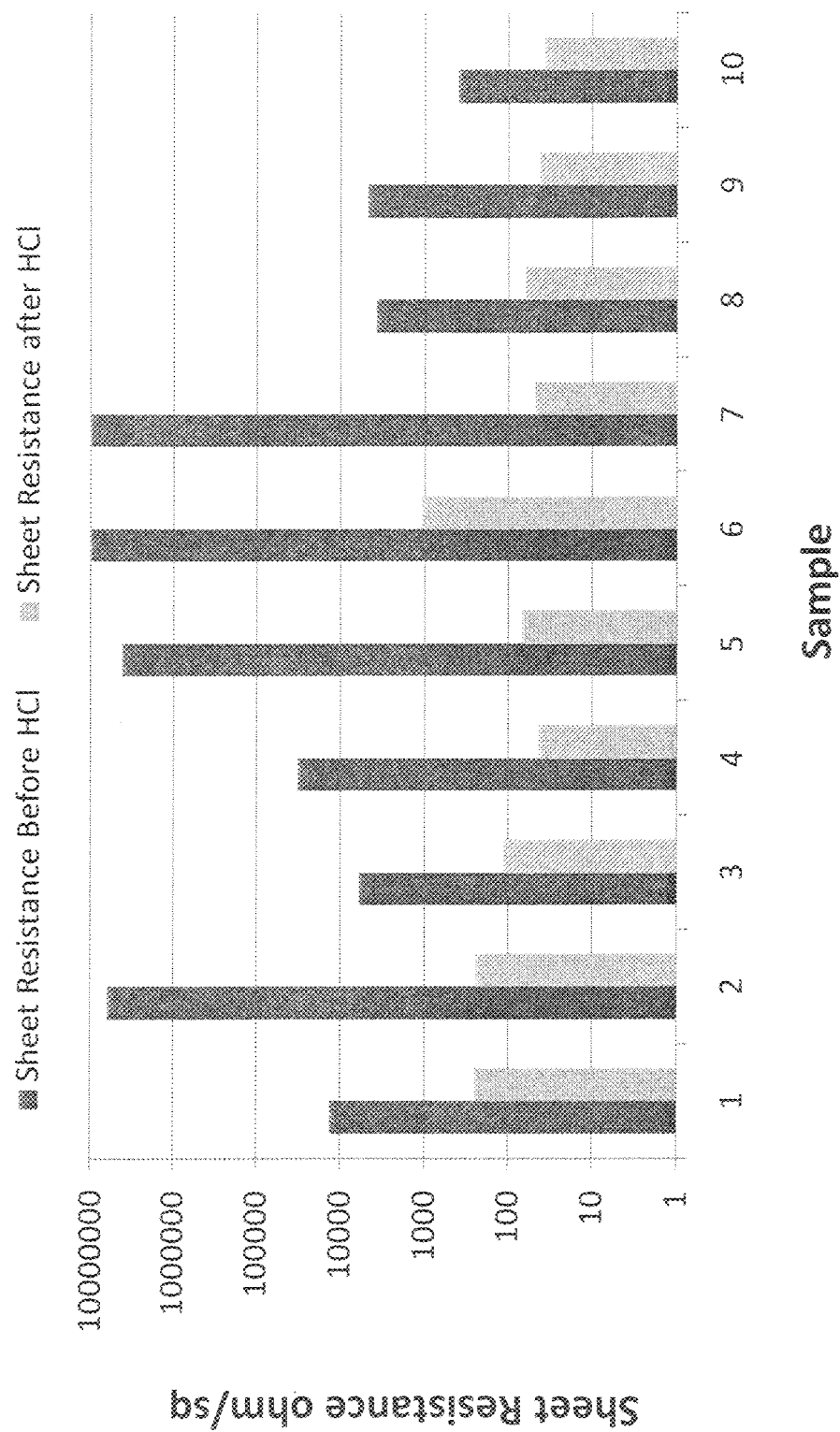
FIG. 3 is a plot of sheet resistance of the samples from the second vendor tested before and after the HCl vapor treatment showing dramatic improvement in conductivity.

Because the large numerical range involved, the data were plotted in logarithmic format in figures so the small numbers can also be visualized graphically. The data from Table 1 was plotted in FIG. 2 and data from Table 2 was plotted in FIG. 3. The films corresponding to the electrical conductivity results in Tables 1 and 2 had moderate loadings with corresponding reasonable transparency to visible light. As shown in FIG. 2, the conductivity of the AgNWs film improved over 4 to 5 orders of magnitude after the HCl vapour treatment. Additionally, these AgNWs films showed transparencies at 550 nm greater than 75%, which decreased less than 0.5% after HCl vapor treatment. Similarly, in FIG. 3, dramatic improvement in conductivity was also observed. The properties of the nanowire networks after fusing were relatively independent of the properties of the initial nanowires for these two sets of nanowires, but the longer nanowires exhibited overall a reduced electrical resistance prior to fusing.

Figure 4:
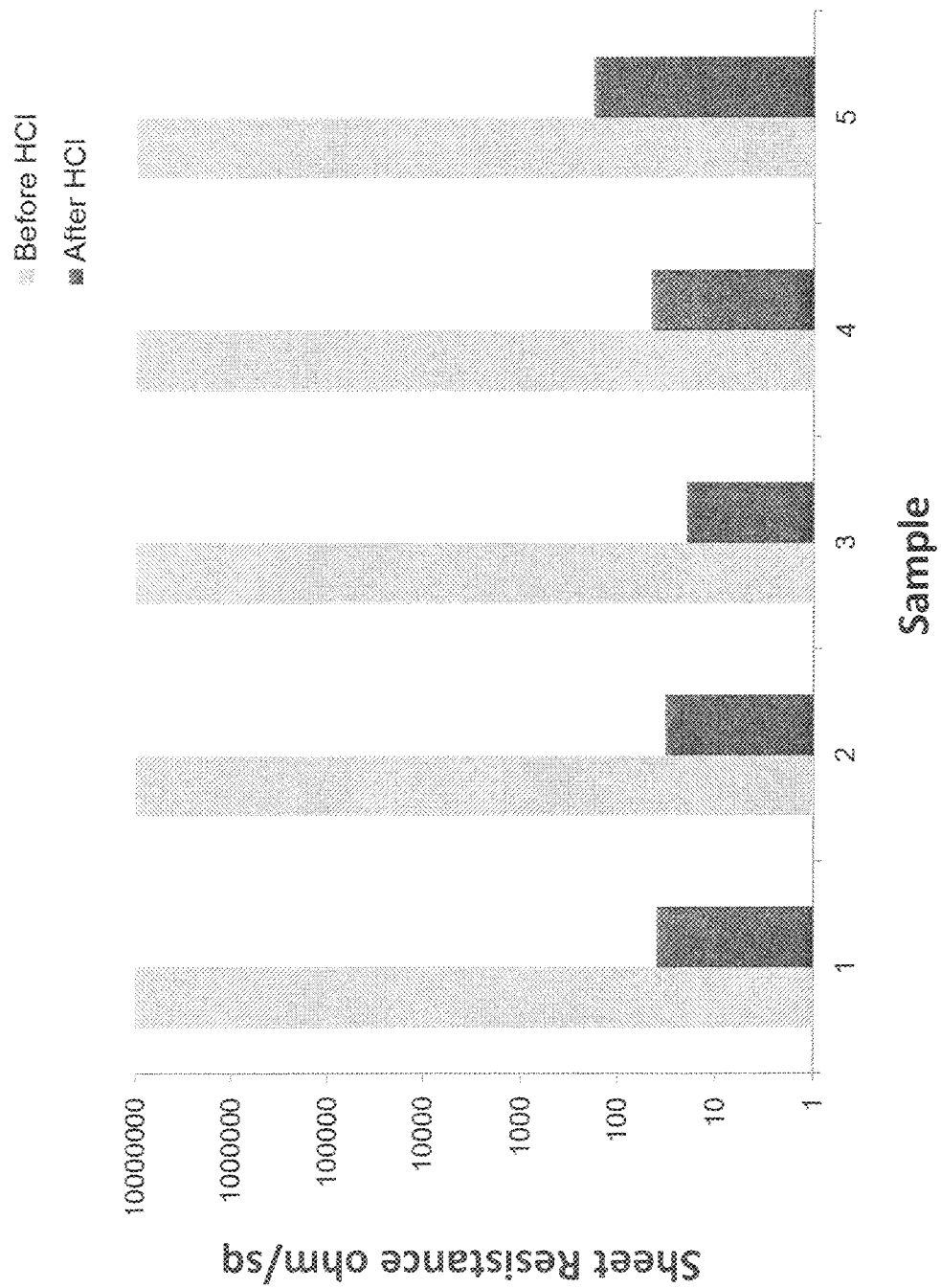
FIG. 4 is a plot of sheet resistance of the samples tested before and after the HCl vapor treatment having a transparency at 550 nm greater than 85%.

Additional AgNWs films were formed that has transparencies at 550 nm greater than 85%. These films were also treated with HCl vapor for about 10 seconds, and the sheet resistances of the AgNWs films before and after the HCl vapour treatment were measured. The results for one set of samples are presented in Table 3, and results for another set of samples are plotted in FIG. 4. Samples 2, 3, and 4 in FIG. 4 in particular have sheet conductivity between 30 to 50 ohm/sq while maintaining the transparency of the films above 85%. The results shown in Table 3 clearly demonstrate the ability to obtain transmission with 550 nm light greater than 90% with sheet resistance values less than 50 ohm/sq.

TABLE 3

| Resistance Prior to Sintering | Resistance After Sintering | Transmission at 550 nm (Conductive Film Only) |
|---|---|---|
| 801 | 45 | 89.1 |
| >10$^6$ | 40 | 88.9 |
| >10$^6$ | 33 | 88.1 |
| >10$^6$ | 20 | 87.8 |
| >10$^6$ | 46 | 90.6 |
| >10$^6$ | 182 | 92.4 |
| >10$^6$ | 129 | 91.6 |
| >10$^6$ | 85 | 89.2 |

Example 2—Observation of the Fusing of the Silver Nanowires

This example provides evidence of nanowire physical fusing as a result of contact with chemical fusing agents.

Figure 5:
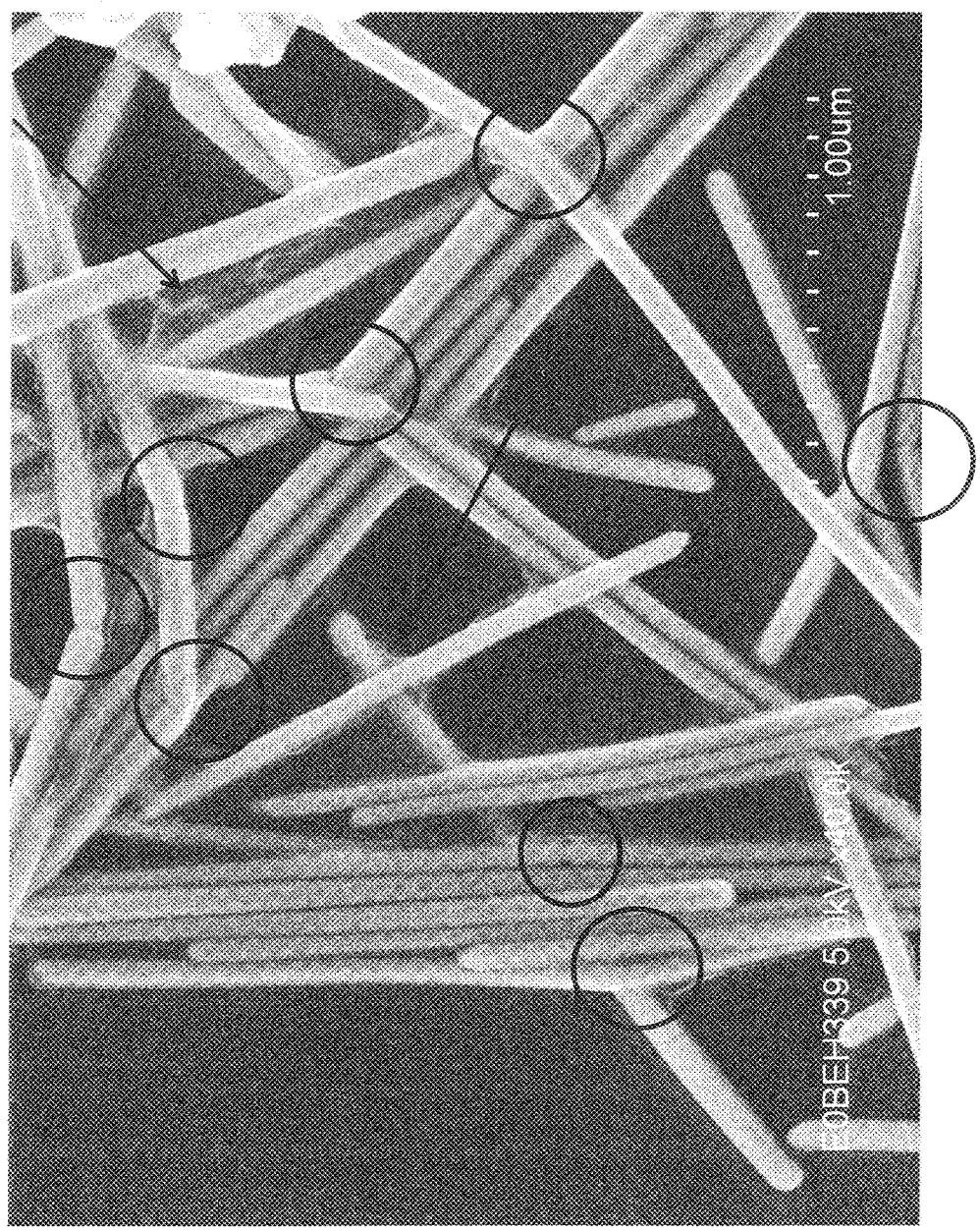
FIG. 5 is a scanning electron micrograph (SEM) of silver nanowires before any treatment.
Figure 6:
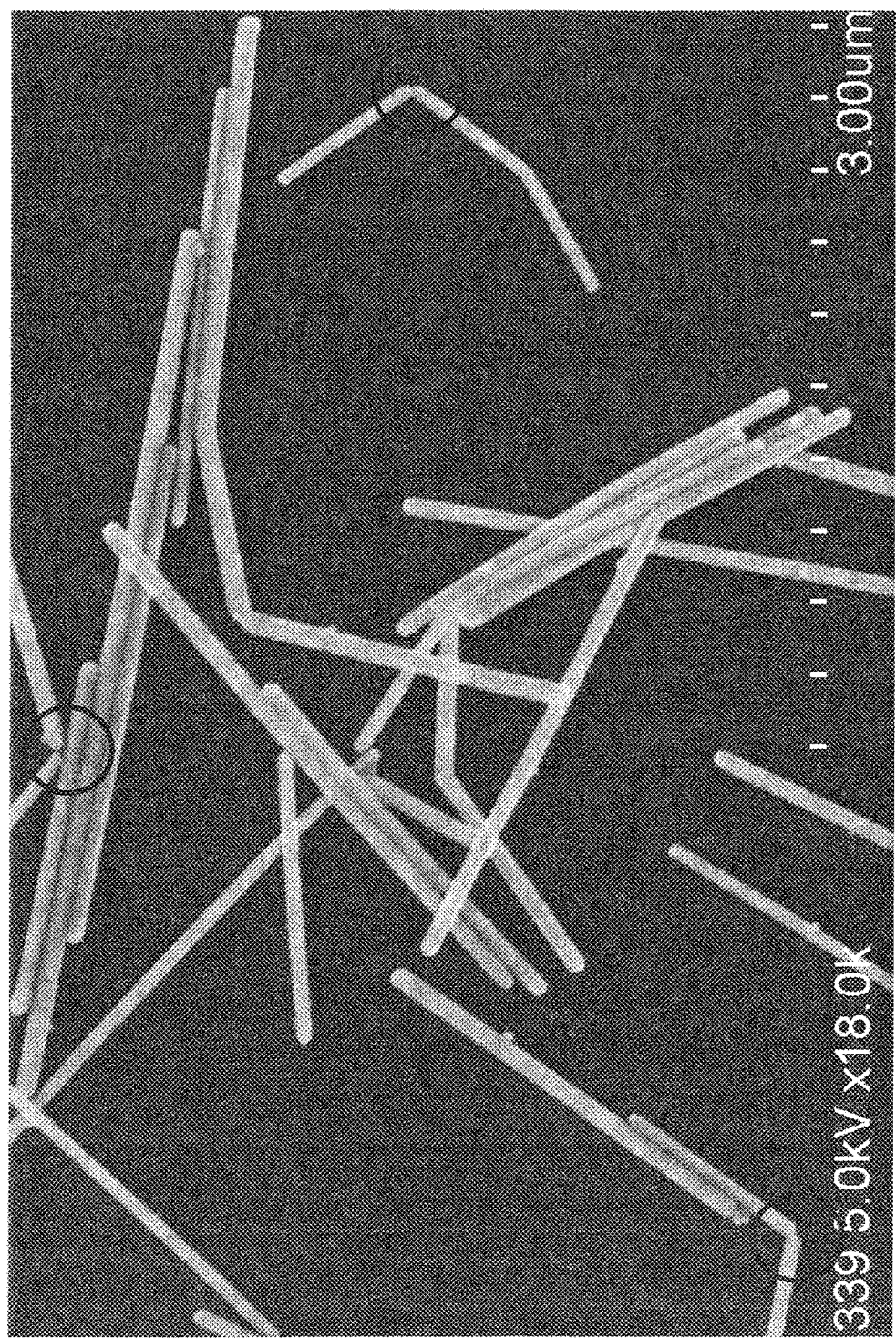
FIG. 6 is a SEM micrograph of silver nanowires after heat treatment.

The dramatic conductivity improvement observed in Example 1 can be attributed to the fusing of some of the silver nanowires with adjacent silver nanowires. Scanning electron micrographs (SEM) of the silver nanowires before treatment were obtained and are shown in FIG. 5. As shown in FIG. 5, some of the ends (indicated by the circles) of the silver nanowires appear to touch each other, but the ends apparently do not appear to be fused together. Additionally, polyvinylpyrrolidone (PVP) coating (indicated by arrows in the figure) can be seen to be present around the rods. As a comparison, the silver nanowires shown in FIG. 5 were heated at 100° C. for 10 minutes. No appreciable conductivity change has been observed after the heating. SEM micrographs of the silver nanowires after the heat treatment were obtained and are shown in FIG. 6. Heating does not appear to have fused the ends as shown in FIG. 6, some of the ends (indicated by the circles) of the silver nanowires do not appear to be fused together. Scanning electron micrographs were obtained for nanowire networks after the HCl vapor treatment and are shown in FIG. 7. SEM of the silver nanowires in FIG. 7 after the HCl treatment showed the ends (indicated by the circles) of the silver nanowires have been fused together, and other locations of contact between adjacent nanowires are believed to similarly fuse to form fused silver nanowire networks.

Example 3—Fabrication of Transparent Conductive Material Using Halide Solution Treatment This example demonstrated the reduction in electrical resistance through the treatment of the networks with solutions containing halide anions.

Figure 8:
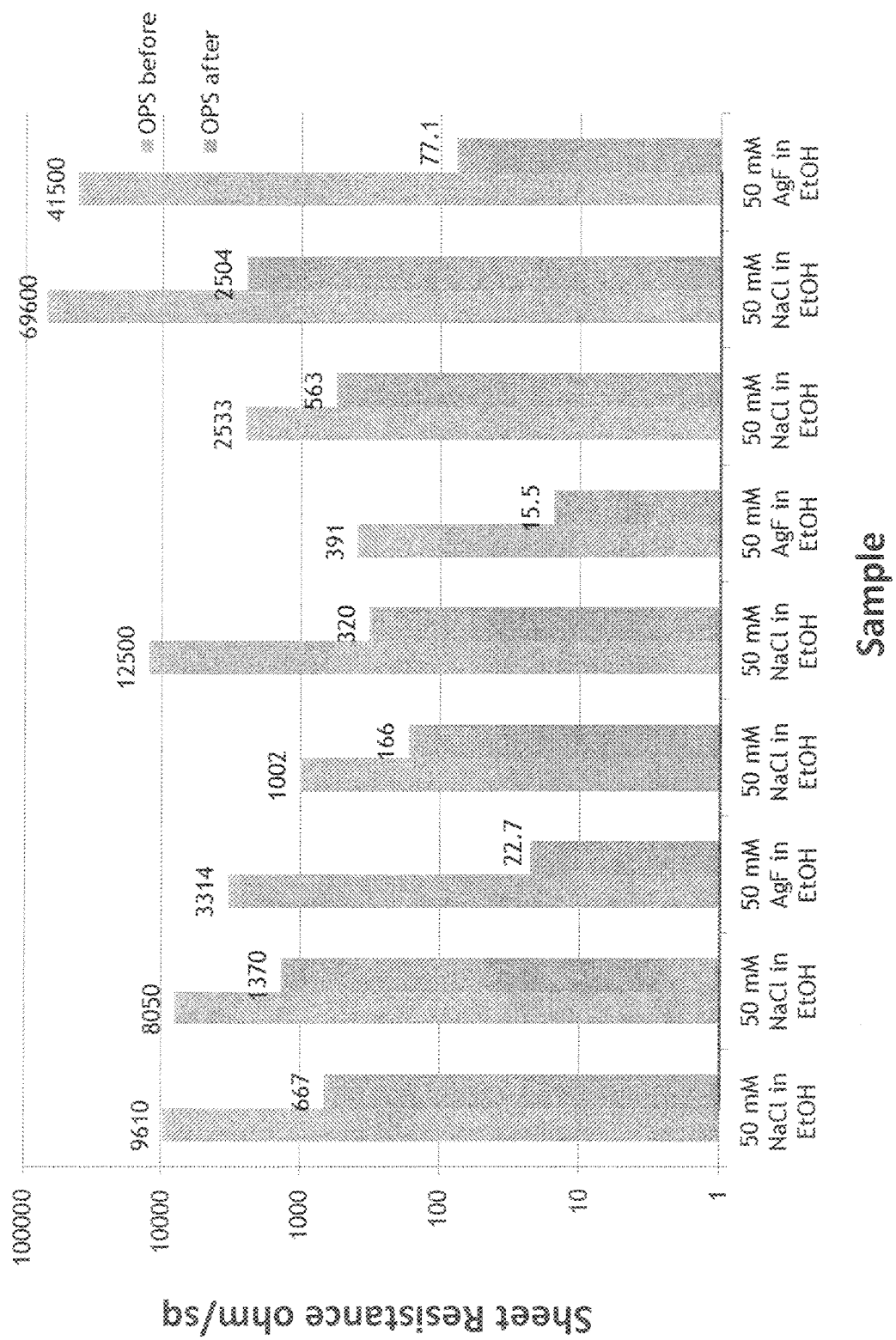
FIG. 8 is a plot of sheet resistance of samples treated with 5 mM NaCl in ethanol and AgF in ethanol solutions.

Specifically, 50 mM solutions of AgF or NaCl in ethanol were used to treat the AgNWs films. When the fusing agent solution is used, the AgNWs film was submerged or covered with the fusing agent solution for about 10 to about 30 seconds, or dilute solutions of AgF or NaCl were spray coated (from ethanol) onto the AgNW. The AgNWs were then allowed to dry. The sheet resistance of the AgNWs film before and after the treatment with the halide solutions were measured and the results are shown in FIG. 8. As shown in FIG. 8 dramatic conductivity improvement is also observed of the AgNWs films treated with halide solutions, with AgF treated samples showing even more pronounced improvement compared to the NaCl treated samples. In general, the transmission of light changed marginally (<5%) and less than 1% if residual salt solution was removed. Residual salt was removed by spraying gently with water or ethanol.

Dramatic improvements in conductivity with negligible changes in transparency are important for transparent conductor applications. The conductivity of transparent conductors is often improved by adding more conducting materials, for example more AgNWs, but the transmission can dramatically decrease. The methods and processes described herein provide a convenient and cost effective approach to dramatically improve the conductivity of nanowire materials without sacrificing transparency or adding additional nanowires.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A method of forming a transparent electrically conductive film, the method comprising:
   depositing a dispersion of metal nanowires onto a substrate surface;
   delivering a solution comprising a fusing agent in a solvent onto the substrate surface; and
   drying the substrate surface after depositing the metal nanowires and delivering the fusing agent solution to fuse the metal nanowires into a fused metal nanowire network, wherein the fused metal nanowire network has a transmittance for visible light at 550 nm through the fused metal nanowire network of at least about 85% and a sheet resistance of no more than about 250 Ohms/square and wherein the fusing agent comprises a metal halide salt.

2. The method of claim 1 wherein the fusing agent comprises LiCl, NaF, NaCl, NaBr, NaI, KCl, $MgCl_2$, $CaCl_2$, $AlCl_3$, $NH_4Cl$, $NH_4F$, AgF, or a combination thereof.

3. The method of claim 1 wherein the solution has a halide ion concentration from about 0.1 mM to about 10 M and wherein the solvent comprises an alcohol, water, or a combination thereof.

4. The method of claim 1 wherein the metal nanowire dispersion further comprises the fusing agent such that the depositing of the nanowire dispersion and the fusing agent solution are performed simultaneously.

5. The method of claim 1 wherein the delivering of the fusing agent solution is performed after depositing the metal nanowire dispersion.

6. The method of claim 1 wherein the metal nanowires comprise copper, gold, tin, iron, titanium, indium, platinum, palladium, nickel, cobalt, or an alloy combination thereof.

7. The method of claim 1 wherein the metal nanowires comprise silver nanowires.

8. The method of claim 1 wherein the metal nanowires have a surface loading level on the substrate that is about 0.1 $\mu g/cm^2$ to about 5 $mg/cm^2$.

9. The method of claim 1 wherein the fused metal nanowire network has a transmittance for visible light at 550 nm of at least about 90% and a sheet resistance of no more than about 100 Ohms/square.

10. The method of claim 1 wherein the fused metal nanowire network has a transmittance for visible light at 550 nm of at least about 90% and a sheet resistance of no more than about 80 Ohms/square.

11. The method of claim 1 wherein the fusing agent comprises AgF.

12. The method of claim 11 wherein the metal nanowires comprise silver nanowires.

13. The method of claim 11 wherein the concentration of AgF is from about 0.1 mM to about 1 M.

14. The method of claim 11 wherein the metal nanowire dispersion further comprises the fusing agent such that the depositing of the nanowire dispersion and the fusing agent solution are performed simultaneously.

* * * * *